(12) United States Patent
Hamada et al.

(10) Patent No.: US 9,748,425 B2
(45) Date of Patent: Aug. 29, 2017

(54) PHOTOELECTRIC CONVERSION ELEMENT AND PHOTOVOLTAIC CELL

(71) Applicant: Seiko Epson Corporation, Tokyo (JP)

(72) Inventors: Yasuaki Hamada, Chino (JP); Satoshi Kimura, Fujimi-machi (JP); Setsuya Iwashita, Nirasaki (JP); Akio Konishi, Matsumoto (JP)

(73) Assignee: Seiko Epson Corporation (JP)

( * ) Notice: Subject to any disclaimer, the term of this patent is extended or adjusted under 35 U.S.C. 154(b) by 92 days.

(21) Appl. No.: 14/184,054

(22) Filed: Feb. 19, 2014

(65) Prior Publication Data

US 2014/0251436 A1    Sep. 11, 2014

(30) Foreign Application Priority Data

Mar. 11, 2013    (JP) .................. 2013-048519

(51) Int. Cl.
- *H01L 31/0264* (2006.01)
- *H01L 31/072* (2012.01)
- *H01L 31/0328* (2006.01)

(52) U.S. Cl.
CPC ........ *H01L 31/072* (2013.01); *H01L 31/0328* (2013.01); *Y02E 10/50* (2013.01)

(58) Field of Classification Search
CPC .................................................. H01L 31/032
See application file for complete search history.

(56) References Cited

U.S. PATENT DOCUMENTS

| 4,927,721 A | 5/1990 | Gratzel et al. |
| 2012/0017976 A1* | 1/2012 | Nechache et al. ............ 136/255 |

FOREIGN PATENT DOCUMENTS

| JP | 53-033084 | | 3/1978 |
| JP | 01-220380 | | 9/1989 |
| JP | 2004-172167 A | | 6/2004 |
| JP | 2010-156787 | * | 7/2010 |
| JP | 2012-038783 A | | 2/2012 |

OTHER PUBLICATIONS

Golovko et al., Structure and Lattice Dynamics of Heterostructures Based on Bismuth Ferrite and Barium Strontium Titanate on Magnesium Oxide Substrates, Magnetism and Ferroelectricity, Physics of the Solid State, vol. 53, No. 7, pp. 1432-1438 (2010).*

Pignolet et al., Orientation dependence of ferroelectricity in pulsed-laser-deposited epitaxial bismuth-layered perovskite thin films, Applied Physics A, Materials, Science and Processing, pp. 9, (2000).*

H. Li et al., "Ultraviolet Photovoltaic Effect in $BiFeO_3/Nb\text{-}SrTiO_3$ Heterostructure", American Institute of Physics, Journal of Applied Physics 112, Jul. 26, 2012, pp. 083506-1 through 083506-4.

* cited by examiner

*Primary Examiner* — Jayne Mershon

(74) *Attorney, Agent, or Firm* — Harness, Dickey & Pierce, P.L.C.

(57) ABSTRACT

A photoelectric conversion element includes a PN junction formed from an N-type oxide layer and a P-type oxide layer. The P-type oxide layer is formed from an oxide having a perovskite structure.

10 Claims, 2 Drawing Sheets

PHOTOELECTRIC CONVERSION ELEMENT AND PHOTOVOLTAIC CELL

BACKGROUND

1. Technical Field

The present invention relates to a photoelectric conversion element using an oxide semiconductor and a photovoltaic cell.

2. Related Art

In the related art, a photovoltaic (photoelectric conversion element) using silicon has attracted attention, as an environmentally-friendly power supply. As the photovoltaic using silicon, a battery in which a PN junction is formed in a single-crystal or polycrystal silicon substrate is disclosed (refer to JP-A-53-33084).

However, in the above-mentioned photovoltaic, the manufacturing cost is high, and it is necessary to precisely control the manufacturing conditions. In addition, high amount of energy is necessary for manufacturing of the photovoltaic. Therefore, it is difficult to say that the photovoltaic is an energy-saving power supply.

SUMMARY

An advantages of some aspects of the invention is to provide a photoelectric conversion element in which PN junction is formed by a new oxide semiconductor and which is capable of being manufactured in a convenient and reproducible manner, and a photovoltaic.

According an aspect of the invention, there is provided a photoelectric conversion element including a PN junction formed from an N-type oxide layer and a P-type oxide layer. The P-type oxide layer is formed from an oxide having a perovskite structure.

In the aspect, since the PN junction is formed by the P-type semiconductor layer having the perovskite structure, it is possible to realize inexpensive photoelectric conversion element in a relatively convenient and reproducible manner.

Here, the oxide having the perovskite structure may contain at least one element selected from Pb, Bi, Li, Na, and K at an A site. According to this, it is possible to form the P-type oxide layer in a more convenient and reproducible manner, and thus photoelectric conversion efficiency is further improved.

In addition, the oxide having a perovskite structure may contain Bi at the A site and Fe at a B site. According to this, it is possible to form the P-type oxide layer in a more reliable manner, and thus the photoelectric conversion efficiency is further improved.

In addition, the N-type oxide layer may be formed from an oxide having a perovskite structure. According to this, an excellent PN junction can be formed between the N-type oxide layer and the P-type oxide layer, and thus the photoelectric conversion efficiency is further improved.

In addition, the N-type oxide layer may be formed from an oxide which has a perovskite structure containing titanium and strontium, and in which a part of strontium is substituted with a positive trivalent metal element or a part of titanium is substituted with a positive pentavalent metal element. According to this, it is possible to form the PN junction in a more reliable manner, and thus the photoelectric conversion efficiency is further improved.

In addition, the P-type oxide layer may be formed on a base body formed from an N-type oxide by a film forming unit to form a PN junction. According to this, it is possible to form the PN junction in a more reliable manner, and thus the photoelectric conversion efficiency is further improved.

In addition, the N-type oxide layer and the P-type oxide layer may be formed on a base body by a film forming unit to form a PN junction. According to this, it is possible to form the PN junction in a more reliable manner, and thus the photoelectric conversion efficiency is further improved.

According to another aspect of the invention, there is provided a photovoltaic cell including the photoelectric conversion element.

In this aspect, since the photovoltaic cell includes the photoelectric conversion element in which the PN junction is formed by the P-type semiconductor layer having a perovskite structure, it is possible to realize an inexpensive photovoltaic in a relatively convenient and reproducible manner.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, the invention will be described in detail based on an embodiment. The embodiment illustrates an aspect of the invention, and is not intended to limit the invention, and an arbitrary modification can be made to a range of various inventions.

Figure 1:
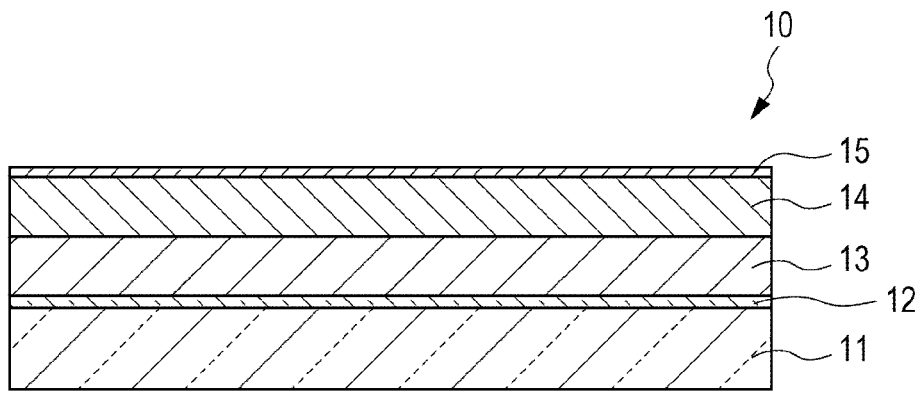
FIG. 1 is a view illustrating a schematic configuration of a photoelectric conversion element according to an embodiment of the invention.

FIG. 1 shows a view illustrating a schematic configuration of a photoelectric conversion element (photovoltaic) according to an embodiment of the invention.

As shown in FIG. 1, a photoelectric conversion element 10 includes a transparent electrode 12 that is provided on a transparent substrate 11, an N-type oxide layer 13 that is provided on the transparent electrode 12, a P-type oxide layer 14 that is provided on the N-type oxide layer 13, and a counter electrode 15.

Here, the transparent substrate 11 is not particularly limited as long as the substrate 11 is a substrate having transparency capable of transmitting visible light, but a glass substrate such as quartz and soda-lime glass may be used. In addition, the transparent electrode 12 has translucency, and various transparent electrodes such as a transparent electrode formed from indium tin oxide (ITO), a zinc oxide based transparent electrode, and lanthanum nickelate (LNO) may be used as the transparent electrode 12.

Examples of a material of the N-type oxide layer 13 include titanium oxides, tin oxide based conductive materials such as indium tin oxide (ITO) and FTO, zinc oxide based conductive materials, strontium ruthenate ($SrRuO_3$), and lanthanum nickelate ($LaNiO_3$). In addition, an oxide having a perovskite structure may be used. Examples of the oxide include element-doped strontium titanate, and the like. In any case, there is no limitation to the above-described material as long as the material forms an N-type oxide.

The N-type oxide layer 13 is a semiconductor or a conductor. However, in a case where a conductor or a semiconductor close to the conductor can also serve as an electrode, the transparent electrode 12 may be omitted. In addition, with regard to a configuration shown in FIG. 1, it is necessary for the N-type oxide layer 13 to have optical transparency, but all of the exemplified components have translucency.

It is preferable that the P-type oxide layer 14 be formed from an oxide having a perovskite structure and include at least one element selected from lead (Pb), bismuth (Bi), lithium (Li), sodium (Na), and potassium (K) at an A site. These elements have a tendency to volatilize. Accordingly, in a case where these elements are contained in an A site, a defect such as deficiency tends to occur, and a P-type semiconductor is likely formed. In addition, in a case where an element such as iron and titanium, which have a plurality of valences different from each other, is contained in a B site, it enters an electron deficient state due to variation in a valence of the element and thus a P-type semiconductor is likely formed.

Examples of the oxide which has a perovskite structure and which becomes a P-type semiconductor include a perovskite material such as lead titanate ($PbTiO_3$), lead zirconate titanate (Pb(Zr, Ti)$O_3$), lithium niobate ($LiNbO_3$), lithium tantalate ($LiTaO_3$), sodium niobate ($NaNbO_3$), sodium tantalate ($NaTaO_3$), potassium niobate ($KNbO_3$), potassium tantalate ($KTaO_3$), sodium bismuth titanate (($Bi_{1/2}Na_{1/2}$)$TiO_3$), potassium bismuth titanate (($Bi_{1/2}K_{1/2}$)$TiO_3$), and bismuth ferrite ($BiFeO_3$), a material obtained by substituting a part of the A site or the B site of the perovskite material with another element, and a solid-solution having at least one of the above-described materials as a component, but there is no limitation to the above-described material as long as the material becomes a P-type oxide.

Examples of a representative material include a bismuth ferrite based composite oxide having a perovskite structure. Examples of the element that substitutes a part of Bi at the A site include lanthanoids, barium (Ba), and the like. Examples of the lanthanoids include lanthanum (La), samarium (Sm), cerium (Ce), and the like. Examples of the element that substitutes Fe of the B site include manganese (Mn), aluminum (Al), cobalt (Co), titanium (Ti), and the like.

Specifically, bismuth ferrate ($BiFeO_3$), bismuth ferrate aluminate (Bi(Fe, Al)$O_3$), bismuth ferrate manganate (Bi(Fe, Mn)$O_3$), bismuth lanthanum ferrite manganate ((Bi, La) (Fe, Mn)$O_3$), bismuth barium ferrate manganate titanate ((Bi, Ba) (Fe, Mn, Ti)$O_3$), bismuth ferrate cobaltate (Bi(Fe, Co)$O_3$), bismuth cerium ferrate ((Bi, Ce)$FeO_3$), bismuth cerium ferrate manganate ((Bi, Ce) (Fe, Mn)$O_3$), bismuth lanthanum cerium ferrate ((Bi, La, Ce)$FeO_3$), bismuth lanthanum cerium ferrate manganate ((Bi, La, Ce) (Fe, Mn)$O_3$), bismuth samarium ferrate ((Bi, Sm)$FeO_3$), bismuth barium ferrate manganate titanate ((Bi, Ba) (Fe, Mn, Ti)$O_3$), bismuth chromate ferrate (Bi(Cr, Fe)$O_3$), bismuth potassium ferrate manganate titanate ((Bi, K) (Fe, Mn, Ti)$O_3$), and the like may be exemplified. In addition, a material obtained by adding, for example, Bi(Zn, Ti) $O_3$, (Bi, K)$TiO_3$, (Bi, Na)$TiO_3$, or (Li, Na, K) (Ta, Nb)$O_3$ to the above-described composite oxide is possible.

In addition, it is necessary for a PN junction to be formed between the P-type oxide layer 14 and the N-type oxide layer 13.

It is not necessary for the counter electrode 15 to be transparent, and the counter electrode 15 may have electrical conductivity. Examples of a material of the counter electrode 15 include metal elements such as Pt, Ir, Au, Al, Cu, Ti, and stainless steel, tin oxide based conductive materials such as indium tin oxide (ITO) and FTO, zinc oxide based conductive materials, oxide conductive materials such as strontium ruthenate ($SrRuO_3$), lanthanum nickelate ($LaNiO_3$), and element-doped strontium titanate, and a conductive polymer, and the like. However, there is no limitation to the above-described materials as long as electrical conductivity is provided.

With regard to the above-described photoelectric conversion element 10, the transparent electrode 12, the N-type oxide layer 13, the P-type oxide layer 14, and the counter electrode 15 can be formed on the transparent substrate 11 in a film forming process, and thus cost reduction is realized. Examples of the film forming process include a vapor phase method such as a CVD method, a liquid phase method such as an application method, a solid phase method such as a sputtering method, a printing method, and the like. Particularly, the liquid phase method is optimally used for mass production and cost reduction.

In addition, the P-type oxide layer 14 or the N-type oxide layer 13 in some cases is formed using an oxide having a perovskite structure. However, with regard to an oxide film having a perovskite structure, film formation is relatively easy, and the oxide film can be manufactured with excellent reproducibility without accurately controlling manufacturing conditions. Accordingly, convenience and reproducibility are more excellent in comparison to a process of forming a P-type or N-type region by doping silicon with an element in the related art.

In the photoelectric conversion element 10, when light is emitted from a transparent substrate 11 side, if electrons of a valence band absorb light in a PN junction region between the N-type oxide layer 13 and the P-type oxide layer 14, photoelectrons and holes are generated due to a photoelectric effect. The photoelectrons move to the N-type oxide layer 13 and the holes move to the P-type oxide layer 14, respectively, and thus an electromotive force is generated.

Here, since the P-type oxide layer 14 formed from an oxide having a perovskite structure is substantially transparent, the N-type oxide layer 13 and the P-type oxide layer 14 in a configuration shown in FIG. 1 may be replaced with each other.

Figure 2:
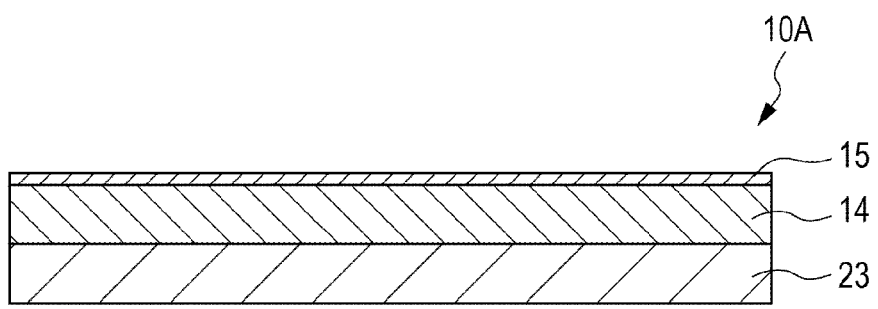
FIG. 2 is a view illustrating a schematic configuration of a photoelectric conversion element according to another embodiment of the invention.

FIG. 2 shows a configuration in which an N-type oxide serves as a transparent substrate and a transparent electrode.

As shown in FIG. 2, in the photoelectric conversion element 10A, the P-type oxide layer 14 as shown in FIG. 1 is provided on an N-type oxide substrate 23 which serves as a base body and an electrode, and the counter electrode 15 is provided on the P-type oxide layer 14.

Here, the N-type oxide substrate 23 is formed from strontium titanate in which a part of strontium is substituted with a positive trivalent metal element or a part of titanium is substituted with a positive pentavalent metal element. For example, the N-type oxide substrate 23 is formed from strontium titanate doped with Nb.

The strontium titanate substrate is commercially available, and thus it is possible to reliably form the PN junction by forming the P-type oxide layer 14 on the strontium titanate substrate. Accordingly, it is possible to carry out the manufacturing in a convenient and reproducible manner.

A photovoltaic cell can be manufactured by assembling a plurality of the above-described photoelectric conversion elements according to a typical method.

Example

A thin film of a $BiFeO_3$ based P-type oxide material was formed on a $SrTiO_3$ (100) substrate doped with 0.05 wt % of Nb, and a Pt electrode was formed on the thin film to prepare a photoelectric conversion element (refer to a configuration of FIG. 2).

The thin film of the $BiFeO_3$ based P-type oxide material was formed according to a spin coating method. Various solutions of Bi, La, Ce, Fe, and Mn, in which 2-ehyl-hexanoic acid was used as a ligand, and n-octane was used as a solvent, were mixed in a substance amount ratio of 82:15:3:99:1 to synthesize a solution. Next, the synthesized solution was applied onto the $SrTiO_3$ (100) substrate doped with 0.05 wt % of Nb at 3,000 rpm according to the spin coating method, heating was carried out for two minutes at 150° C., and then heating was carried out for two minutes at 350° C. The processes were repeated twice, and then heating was carried out for five minutes at 650° C. by using RTA. The above-described processes were repeated eight times to prepare $BiFeO_3$ based thin film which was constituted by a total of 16 layers and which had a film thickness of 1070 nm.

Next, a Pt film having a desired pattern was disposed on the $BiFeO_3$ based thin film in a thickness of 100 nm according to a sputtering method to prepare the photoelectric conversion element according to the example.

Figure 3:
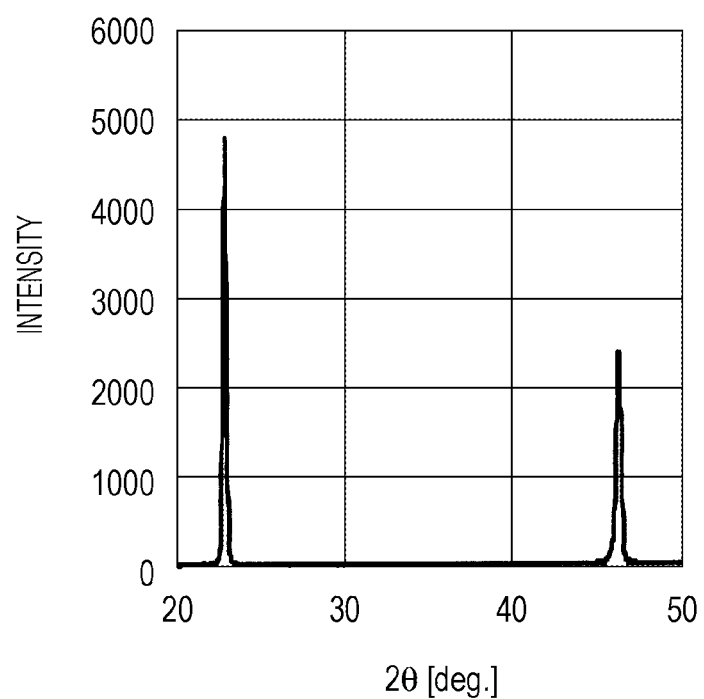
FIG. 3 is a view illustrating X-ray diffraction peaks of a P-type oxide layer of Examples.

Here, X-ray diffraction intensity of the thin film of the $BiFeO_3$ based P-type oxide material was measured, and as shown in FIG. 3, it was confirmed that the thin film was formed in a (100) plane with an orientation conforming to the orientation of the Nb-doped $SrTiO_3$ (100) substrate.

Comparative Example

The same thin film of the $BiFeO_3$ based P-type oxide material as the example was formed on a Si substrate on which a Pt electrode was formed to prepare a photoelectric conversion element.

First, a silicon oxide ($SiO_2$) film having a film thickness of 1070 nm was formed on a surface of a (110) single-crystal silicon (Si) substrate by thermal oxidation. Next, a titanium film having a film thickness of 20 nm was formed on the $SiO_2$ film according to an RF magnetron sputtering method, and thermal oxidation was carried out at 700° C. to form a titanium oxide film having a film thickness of 40 nm. Next, a platinum film, which was oriented in a (111) plane and had a film thickness of 130 nm, was formed on the titanium oxide film according to a DC sputtering method.

The subsequent processes after the formation of $BiFeO_3$ based P-type oxide material were carried out in the same sequence as the example.

Test Example

The following test was carried out with respect to the example and the comparative example.

The photoelectric conversion elements, which were obtained in the example and the comparative example, were irradiated with black light (wavelength: 365 nm) having intensity of 2.5 $mW/cm^2$ to measure an electromotive force.

With regard to the example, the irradiation was carried out from a Nb-doped $SrTiO_3$ (100) substrate side. With regard to the comparative example, since an opaque electrode was formed at an upper side and a lower side of the P-type oxide layer, the irradiation was carried out in a lateral direction.

From the result of the test, with regard to the example, an electromotive force of an open-circuit voltage of 150 mV and a short-circuit current of 12 $\mu A/cm^2$ was observed. On the other hand, with regard to the comparative example, a voltage was not observed at all, and a current was not observed at all in the order of nA. Even when considering a difference in an irradiation area, it was considered that the electromotive force was obtained due to an effect of the PN junction in the example.

The entire disclosure of Japanese Patent Application No. 2013-048519, filed Mar. 11, 2013 is incorporated by reference herein.

What is claimed is:

1. A photoelectric conversion element, comprising:
a PN junction formed from an N-type oxide layer and a P-type oxide layer,
wherein the P-type oxide layer has a (100) orientation, and is formed from an oxide having a perovskite structure selected from the group consisting of lead titanate ($PbTiO_3$), lead zirconate titanate ($Pb(Zr,Ti)O_3$), lithium niobate ($LiNbO_3$), lithium tantalate ($LiTaO_3$), sodium niobate ($NaNbO_3$), sodium tantalate ($NaTaO_3$), potassium niobate ($KNbO_3$), potassium tantalate ($KTaO_3$), sodium bismuth titanate (($Bi_{1/2}Na_{1/2}$)$TiO_3$), potassium bismuth titanate (($Bi_{1/2}K_{1/2}$)$TiO_3$), and bismuth ferrite ($BiFeO_3$).

2. The photoelectric conversion element according to claim 1,
wherein the N-type oxide layer is formed from an oxide having a perovskite structure.

3. The photoelectric conversion element according to claim 1,
wherein the N-type oxide layer is an oxide which has a perovskite structure containing titanium and strontium, and in which a part of strontium is substituted with a positive trivalent metal element or a part of titanium is substituted with a positive pentavalent metal element.

4. The photoelectric conversion element according to claim 1,
wherein the P-type oxide layer is formed on a base body formed from an N-type oxide by a film forming unit to form a PN junction.

5. The photoelectric conversion element according to claim 1,
wherein the N-type oxide layer and the P-type oxide layer are formed on a base body by a film forming unit to form a PN junction.

6. A photovoltaic cell, comprising:
the photoelectric conversion element according to claim 1.

7. A photovoltaic cell, comprising:
the photoelectric conversion element according to claim 2.

8. A photovoltaic cell, comprising:
the photoelectric conversion element according to claim 3.

9. A photovoltaic cell, comprising:
the photoelectric conversion element according to claim 4.

10. A photovoltaic cell, comprising:
the photoelectric conversion element according to claim 5.

* * * * *